United States Patent [19]

Kono

[11] Patent Number: 5,051,915

[45] Date of Patent: Sep. 24, 1991

[54] FREQUENCY MEASURING APPARATUS

[75] Inventor: Hiromi Kono, Higashimatsuyama, Japan

[73] Assignee: Diesel Kiki Co., Ltd., Tokyo, Japan

[21] Appl. No.: 559,390

[22] Filed: Jul. 24, 1990

Related U.S. Application Data

[63] Continuation of Ser. No. 332,371, Mar. 31, 1989, abandoned, which is a continuation of Ser. No. 870,785, Jun. 5, 1986, abandoned.

[30] Foreign Application Priority Data

Jun. 11, 1985 [JP]  Japan ............................. 60-125237

[51] Int. Cl.⁵ ........................................... G01R 23/00
[52] U.S. Cl. .................................... 364/484; 364/565
[58] Field of Search ................................ 364/484, 565

[56] References Cited

U.S. PATENT DOCUMENTS

| | | | |
|---|---|---|---|
| 4,472,776 | 9/1984 | Deleris et al. | 364/569 |
| 4,609,990 | 9/1986 | Sember et al. | 364/484 |
| 4,672,556 | 6/1987 | Shepler | 364/484 |
| 4,683,545 | 7/1987 | Fauvet | 364/484 |

Primary Examiner—Emanuel S. Kemeny
Attorney, Agent, or Firm—James C. Wray

[57] ABSTRACT

To optimize valuable processor time required for the execution of the main control program in an engine control system, execution of no more than two interruption programs in preparation for execution of a frequency calculating program is provided.

6 Claims, 2 Drawing Sheets

FREQUENCY MEASURING APPARATUS

This is a continuation of application Ser. No. 332,371, filed Mar. 31, 1989, which is a continuation of application Ser. No. 870,786, filed June 5, 1986, both abandoned.

BACKGROUND OF THE INVENTION

The present invention relates to a frequency measuring apparatus, more specifically to a frequency measuring apparatus which is adapted to measure the frequency of an input signal with use of a microcomputer.

The conventional control apparatus for controlling an internal combustion engine device by use of a microcomputer is generally arranged to measure the frequency of a prescribed pulse signal by use of a timer function formed in the microcomputer, whereby the engine speed or the like is detected. Such an arrangement is disclosed in, for example, U.S. Pat. No. 4,517,831 which issued on May 21, 1985 and corresponds to Japanese Patent Public Disclosures No. 95465/84. The disclosed device is constructed in such a way that the calculating operation executed in the microcomputer is interrupted in response to the output of a pulse signal from a rotation sensor, the period of the pulse signal is measured by use of the timer, and the frequency of the pulse signal is calculated based on the period measured.

However, this arrangement leads to a problem in the case where the frequency of the signal being measured becomes high since in such a case the calculating operation conducted in the microcomputer is frequently interrupted, which hinders smooth execution of the main program by the microcomputer. This drawback is particularly a problem in a program in which the results obtained by the processing during the interruption is renewed at a predetermined interval, for example, once per program cycle of the main program. More specifically, in such a program, most of the results obtained during the interruptions become useless because of the high frequency of interruption processing and the only result is hinderance of the smooth execution of the main program

SUMMARY OF THE INVENTION

It is an object of the present invention to provide an improved frequency measuring apparatus using a microcomputer.

It is another object of the present invention to provide a frequency measuring apparatus using a microcomputer in which the calculation for the frequency measurement is carried out as an interruption operation executed in response to the signal being measured.

It is still another object of the present invention to provide a frequency measuring apparatus employing a microcomputer wherein the interruption operation for carrying out frequency measurement processing is not carried out unnecessarily even when the frequency of the signal being measured is high.

According to the present invention, in a frequency measuring system for measuring the frequency of a signal being measured at desired intervals, in which said system is constituted by the use of a microcomputer to which the signal being measured is input and a processing operation for calculating a period of the signal being measured can be executed in an interruption made of the microcomputer when a prescribed timing happens in the signal being measured. This system comprises a time data gathering means for outputting a time data representing the time of the occurrence of a designated timing, means for obtaining a time data representing the time of the occurrence of the interruption operation by the use of said time data gathering means, a period calculating means responsive to a serial of two time data for calculating the period of said signal being measured, a frequency calculating means responsive to the result of said period calculating means for repeatedly calculating the frequency of said signal being measured at intervals, and an interruption control means for controlling the interruption operation in such a way that the execution of the interruption operation is inhibited in response to the execution of the period calculation by said period calculating means and the inhibition of execution of interruption operation is released in response to the execution of the frequency calculation by said frequency calculating means.

The invention will be better understood and other objects and advantages thereof will be more apparent from the following detailed description of preferred embodiments with reference to the accompanying drawings.

DESCRIPTION OF THE PREFERRED EMBODIMENTS

Figure 1:
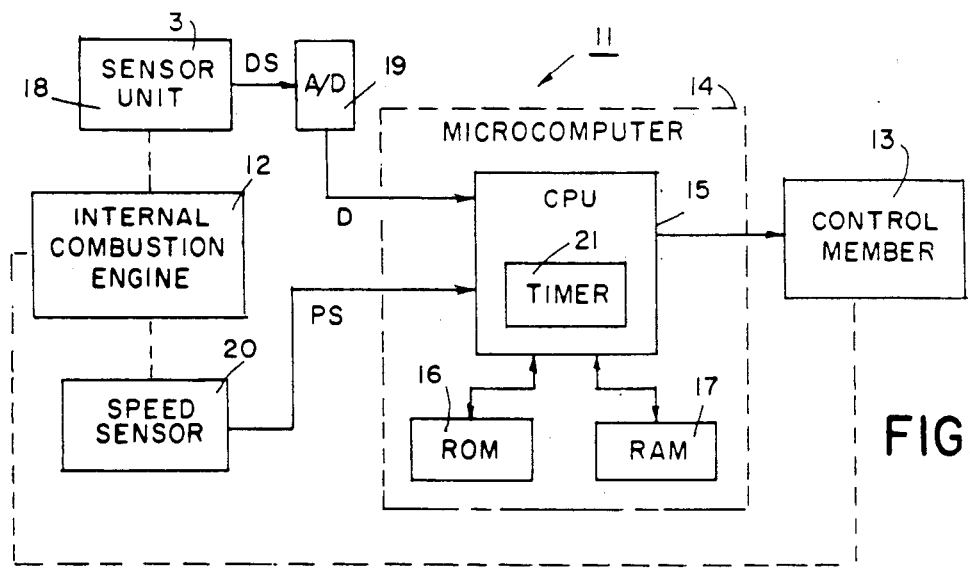
FIG. 1 is a block diagram of a concrete embodiment of an internal combustion engine control apparatus employing a frequency measuring apparatus according to the present invention.

FIG. 1 is a block diagram of an embodiment of an internal combustion engine control apparatus employing a frequency measuring apparatus according to the present invention. The internal combustion engine control apparatus 11 is for electronically controlling the operation of an internal combustion engine 12 such as a gasoline engine, a diesel engine or the like, and is constructed in such a way that a control member 13 for regulating a desired parameter of the internal combustion engine 12 is controlled by the use of a microcomputer 14. The microcomputer 14 is of a conventional type and consists of a central processing unit (CPU) 15, a read only memory (ROM) 16, and a random access memory (RAM) 17. A sensor unit 18 detects a predetermined operating condition of the internal combustion engine 12 and produces a detection signal DS representing the results of the detection. The detection signal DS is changed into digital form by an analog-digital (A/D) converter 19. The output from the A/D converter 19 is input to CPU 15 as operating condition data D which represents the operating condition of the internal combustion engine 12. A speed sensor 20 outputs a pulse signal PS whose frequency corresponds to the rotational speed of the internal combustion engine 12, and the pulse signal PS is input as an interruption signal to the CPU 15.

Figure 2A:
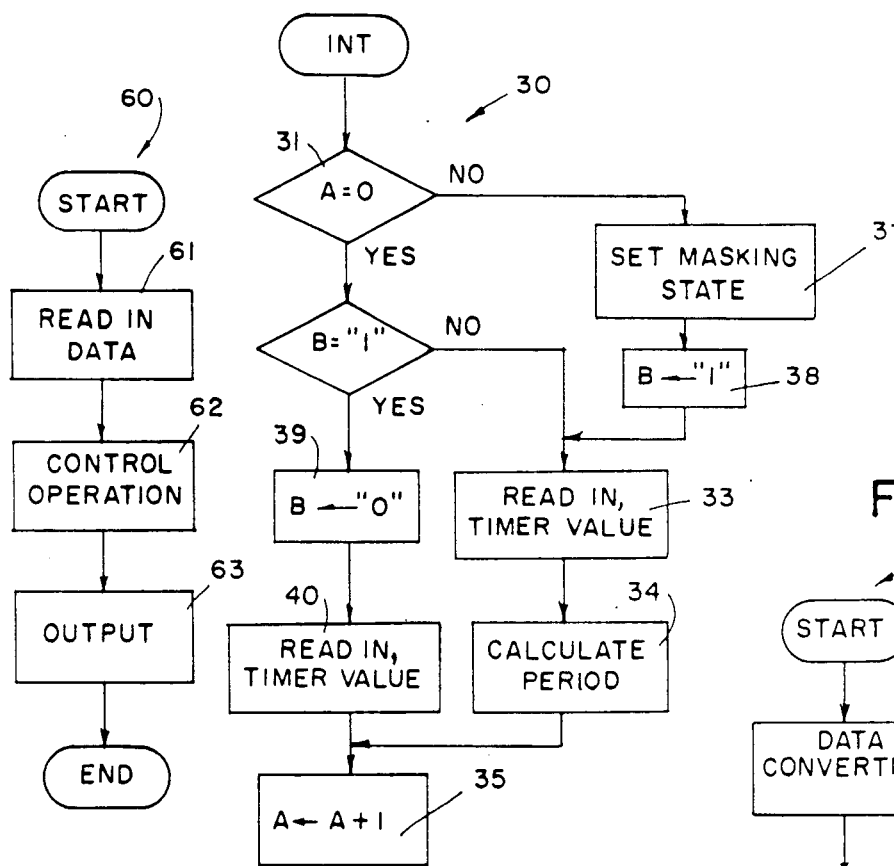
FIGS. 2a and 2b are flow charts representing a program which is to be executed in a microcomputer shown in FIG. 1.
Figure 2B:
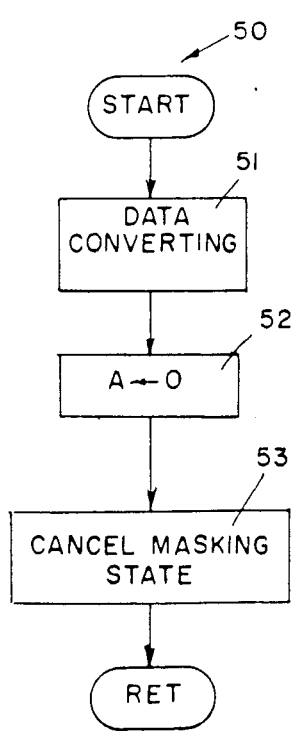

A prescribed control program for controlling the control member 13 is stored in the ROM 16. A flow-chart representing this control program shown in FIGS. 2a and 2b. This control program consists of an interruption program 30, shown in FIG. 2c, whose execution is started in response to each pulse of the pulse signal PS and measures the period of the pulse signal PS at each instant in response to the pulse signal PS to obtain period data representing the measured result, a frequency calculating program 50, shown in FIG. 2b, which is repetitively started at fixed time intervals and calculates the frequency of the pulse signal PS at that time on the basis of the period data obtained by the execution of the interruption program 30 to obtain frequency data representing the result of the calculation, and a main control program 60 which is for controlling the control member 13 to the most suitable state determined in accordance with the operating condition of the engine at each instant on the basis of the frequency data and the operating condition data.

First, the interruption program 30 and the frequency calculating program 50 according to the present invention will be described. When interruption is made in response to the timing of the trailing edge of the pulse signal PS, the execution of the main control program 60 is temporarily ceased and the execution of the interruption program 30 starts. In the interruption program 30, the operation moves to step 31, in which a determination is made as to whether the value of count A is 0 or not. Count value A is employed to show how many times the value of a timer 21 formed within the CPU 15 has been read in after the execution of the calculation of the frequency based on the frequency calculating program 50. Therefore, in the case where the interruption program 30 is executed for the first time after the execution of the frequency calculation program 50, the decision in step 31 becomes YES, and the operation proceeds to step 32 where a decision is made as to whether a flag B is "1". The flag B is used for indicating whether or not the CPU 15 is in the masking state in which the starting of the interruption program 30 by the pulse signal PS is inhibited when the frequency calculation program 50 is about to be executed.

In the case where the interruption program 30 is being executed for the first time after the execution of the frequency calculation program 50, when the result of the decision in step 32 is NO, the operation proceeds to step 33 where the timer value $TM_n$ at that time is read in. In the next step 34, the period of the pulse signal PS at that time is calculated on the basis of the timer value $TM_{n-1}$ obtained by the previous execution of the interruption program 30, and the timer value $TM_n$ obtained at this time. After this, the operation moves to step 35, in which the count value A is incremented by 1, so that the fact that the timer value has been read in once can be shown by count value A and the need for interruption which arose at the falling timing of the pulse signal PS is cleared in the following step 36.

In the case where the interruption program 30 is being executed for the first time after the execution of the frequency calculation program 50, when the result of the decision in step 32 is YES, the operation moves to step 39 in which the flag B is reset. After this, the timer value is read-in in step 40 and the operation moves to step 35. In this case, the calculation for obtaining the period of pulse signal PS is performed.

Although the interruption program 30 is started again at the next falling timing of the pulse signal PS, the operation of the interruption program 30 depends on whether or not the frequency calculating program 50 has already been executed Therefore, a description will first be given for the case where the frequency calculating program 50 was executed before the next falling timing of the pulse signal PS; in other words, the case where the period of the pulse signal PS is longer than the execution period $T_a$ of the frequency calculating program 50.

In the frequency calculating program 50, a data conversion is first performed in step 51 in order to obtain data which represents the frequency of the pulse signal PS on the basis of the period of the pulse signal PS obtained in step 34 of the interruption program 30. After this, the operation moves to step 52 in which the value of count A is brought to zero, and the masking state which prevents the interruption operation from being carried out in response to the pulse signal PS is cancelled in step 53. As a result, the inhibition of the execution of the program 30 in the microcomputer 14 is released and the computer system is allowed to execute the interruption program 30 in response to the signal PS. Consequently, in this case, the content of A becomes zero, so that the operation of the interruption program 30 in the case where the interruption is made again in response to the pulse signal PS, is exactly the same as described above. When the operation of the apparatus 11 is stable in this condition, the flag B is always "0", so that steps 39 and 40 of the interruption program 30 are not executed.

Now, the operation in the case where the interruption program 30 is started to be executed again before the frequency calculating program 50 is executed will be described. In this case, the decision in step 31 becomes NO since step 52 has not been executed yet, and the operation moves to step 37 where a masking state is established. As a result, the execution of the interruption is inhibited whereby it is not permitted that the interruption program 30 is executed in response to the signal PS. After this, flag B is set in the succeeding step 38, and then, step 33 through to 36 are executed. Consequently, in this case, the period of the pulse signal PS is calculated on the basis of the timer value $TM_{n+1}$ obtained in step 33 at this time and the timer value $TM_n$ obtained in the previous execution of the interruption program 30. As described above, since the masking state has been established by the step 37, even if a falling timing of the pulse signal PS arises prior to the frequency calculating program 50 being executed, the execution of the interruption program 30 will not be started in response to the pulse signal PS.

When the frequency calculating program 50 is executed after the start of the interruption program 30 has been inhibited by the masking set operation, the frequency calculation is carried out on the basis of the most recent period value $TM_{n+1} - TM_n$ obtained in the interruption program 30, the value of count A is brought to zero, and the masking state is released.

Consequently, when the interruption program 30 is executed in response to the pulse signal PS after this, the decisions in both steps 31 and 32 become YES so that the operation moves to step 39 in which flag B is reset. After this, the timer value at that time is read in (step 40). When the next interrupting operation arises, A =1 so that step 33 and 34 are executed through steps 37 and 38, and the period of the pulse signal PS is calculated from the timer value obtained in step 40 in the previous interrupting operation, and the timer value obtained in the present step 33.

The main control program 60 is repetitively executed. When the execution of the main control program 60 is commenced, data D and the frequency data obtained in the frequency calculating program 50 are read in in step 61, and a prescribed control calculation is executed in step 62. After this, data representing the result of this control calculation is output in step 63 and the execution is terminated.

The interruption program 30 is executed prior to the other programs in response to the falling timing of the pulse signal PS, so that the execution of the main control program 60 will be interrupted when this interruption occurs. However, in the present apparatus, as mentioned above, the apparatus is so constructed as to inhibit the unnecessary execution of the interruption program so that the execution of the interruption is always performed properly in light of the execution status of the frequency calculating program, so that even when the time period of the pulse signal PS is short, meaningless interruption of the execution of the main control program 60 can be prevented, and the microcomputer can be operated with higher efficiency.

In the following, the foregoing operation will be described with reference to FIG. 3 and FIG. 4.

Figure 3:
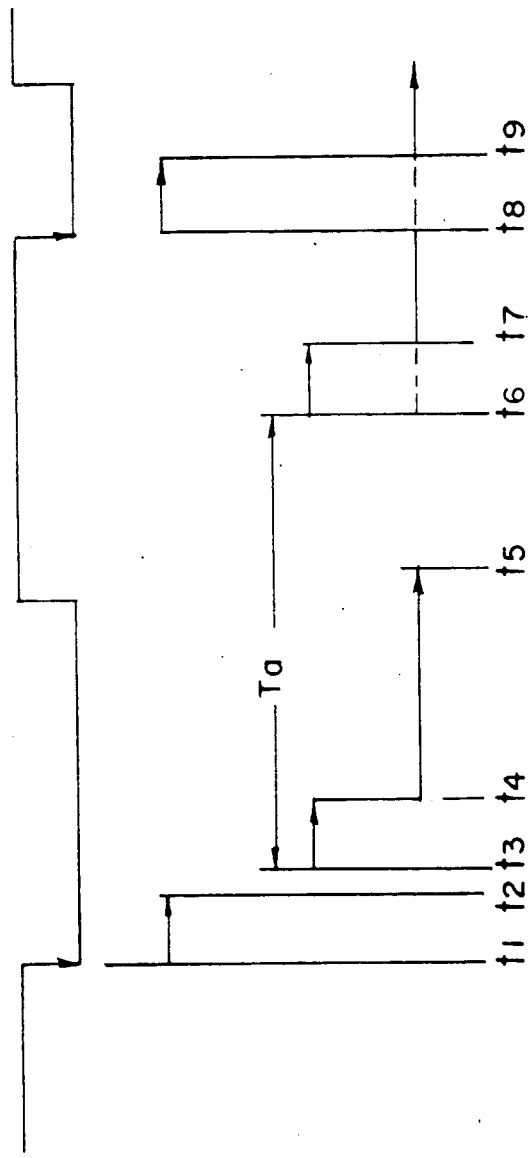
FIGS. 3 and 4 are charts showing the execution status of each program shown in FIGS. 2a, 2b.

FIG. 3 shows the execution status of each program in the case where the period of the pulse signal PS is longer than the execution period $T_a$ of the frequency calculating program 50. In FIG. 3, the solid lines indicate program execution, and the broken lines indicate interruption of program execution. In FIG. 3, the level of the pulse signal PS falls at $t=t_1$ so that the interruption program 30 is executed, and the execution of the interruption program 30 is terminated at $t=t_2$. After this, the execution of the frequency calculating program 50 is commenced at $t=t_3$, and as soon as the execution of the frequency calculating program 50 is terminated at $t=t_4$, the execution of the main control program 60 starts. The execution of the main control program 60 is terminated at $t=t_5$, and the execution of the frequency calculation program 50 is recommenced at $t=t_6$, which is a time $T_a$ later than $t_3$. The period data used at this time is identical to the data obtained at $t=t_2$. As soon as the frequency data is obtained at $t_7$, the main control program 60 is started. However, the execution of the interruption program 30 starts at $t_8$, and this execution is terminated at $t_9$. As a result, the main control program 60 is put into an interrupted state during the interval between the times $t_8$ and $t_9$. The operation is the same in the case where the period of the pulse signal PS coincides with the execution period of the frequency calculating program 50.

In this case, there is no occasion at which the execution of the main program 60 is interrupted unnecessarily by the interruption program 30.

Figure 4:
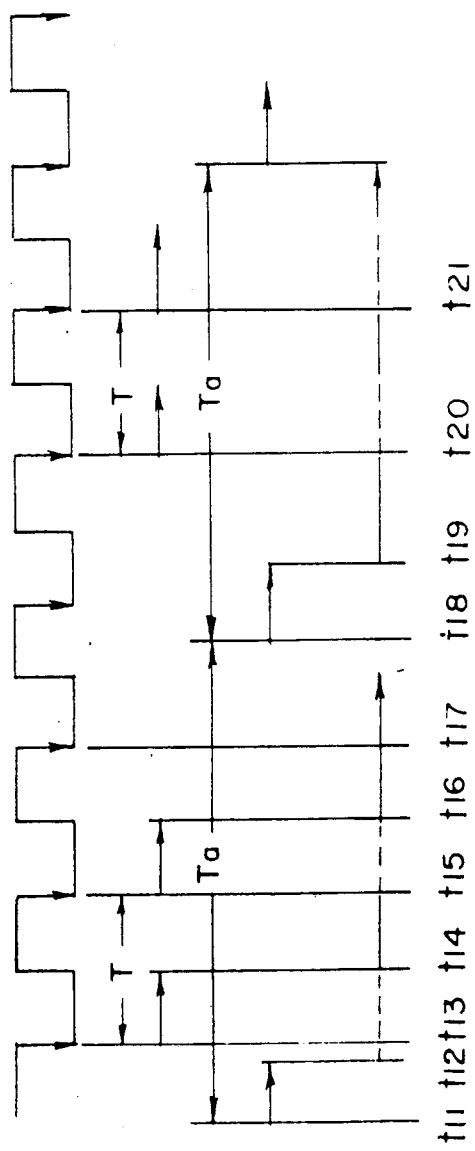

FIG. 4 shows an example of the execution status of the respective programs in the case where the period of the pulse signal PS is shorter than the execution period $T_a$ of the frequency calculating program 50. In this case, the execution of the frequency calculating program 50 starts at $t_{11}$, and after this, execution of the main control program 60 starts at $t=t_{12}$. When the level of the pulse signal PS falls at $t_{13}$ during the execution of the main program 60, an interruption operation is performed since the masking state is cancelled by the execution of the frequency calculating program 50, and an interruption program 30 is executed. Although the execution of the interruption program 30 is terminated at $t_{14}$, the interruption program 30 is also executed at the timing of the succeeding fall in the level of the pulse signal PS at $t=t_{15}$ since the masking condition has not been established. As a result, the time interval from $t=t_{13}$ to $t=t_{15}$ can be measured, and the period of the pulse signal PS at this time is obtained. The execution of the interruption program 30 which is started at $t=t_{15}$ establishes the masking status. Therefore, even if a fall in the level of the pulse signal PS occurs at $t=t_{17}$, the interruption program 30 will not be executed. Furthermore, during the periods of $t_{13} \leq t \leq t_{14}$ and $t_{15} \leq t \leq t_{16}$, the execution of the main control program 60 will be discontinued due to the execution of the interruption program 30.

The period data obtained as described above, is used when the frequency calculating program 50, which is started at $t=t_{18}$, is executed, and the result of the calculation is used when the main program 60, which is started at $t_{19}$, is executed. Since the masking state for inhibiting the execution of the interruption program 30 is cancelled as a result of the frequency calculating program 50 being executed at $t=t_{18}$, the execution of the interruption program 30 starts at $t_{20}$ and $t_{21}$, respectively.

The interruption program 30 is executed only within the required limits even when the period of the pulse signal PS is shorter than the execution period of the frequency calculating program 50. As a result, the execution of the main program is not interrupted unnecessarily, so that disturbance of the execution of the main control program and the occurrence of defects in the control operation can be prevented with high effectiveness.

Furthermore, the above-mentioned embodiment was explained for a case in which the execution period of the frequency calculating program 50 is fixed. However, the present invention is also applicable in the same way in the case where the execution period of the frequency calculating program 50 is not fixed, and is able to provide the same effect.

I claim:

1. A frequency measuring and engine control system for measuring a frequency of a pulse signal at regular intervals, in which said system is constituted by the use of a microcomputer to which a pulse signal being measured is input and the microcomputer is adapted to execute an interruption operation when a prescribed condition occurs in the pulse signal, said system comprising:
   a timer means for outputting time data representing a timing when requested;
   an interruption means responsive to the pulse signal for obtaining a time data from said timer means, the time data representing a time of an occurrence of the prescribed condition of the pulse signal;
   a period calculating means responsive to a series of two time data for calculating a period of the pulse signal during the interruption operation;
   a frequency calculating means responsive to a result of said period calculating means for calculating the frequency of said pulse signal at the regular intervals;
   a masking means for inhibiting the microcomputer from carrying out the interruption operation; and
   a control means for controlling said masking means so as to be rendered operative in response to the completion of the execution of the period calculation by said period calculation means and so as to be rendered operative in response to the completion of the execution of the frequency calculation by said frequency calculating means.

2. A system as claimed in claim 1, wherein said period calculating means has a first means responsive to said pulse signal being measured for reading out and storing a desired time data from said timer means, and a second means for calculating the period of said pulse signal being measured in response to a series of two time data obtained by an operation of said first means.

3. A system as claimed in claim 2, wherein said masking means is rendered operative by said control means in response to an execution of said second means.

4. A system as claimed in claim 1, wherein said frequency calculating means has a converting means for converting the period of said pulse signal being measured obtained by said period calculating means into a corresponding frequency data.

5. An internal combustion engine control apparatus, comprising:
    an internal combustion engine;
    a sensor unit connected to the engine for sensing operating condition and producing detection signals;
    an analog to digital converter connected to the sensor for converting the detection signals to engine data;
    a processor connected to the converter;
    a memory connected to the processor for supplying (a) interruption, (b) frequency calculation and (c) main control programs to the processor;
    means in the processor for sequentially executing the frequency calculation and main control programs at predetermined periods;
    a speed sensor connected to the engine for producing pulses and connected to the processor for supplying the pulses as interrupt signals;
    means in the processor for executing the interruption program upon receipt of the interrupt signals; and
    means in the processor for executing the interruption program no more than twice after each execution of the frequency calculation program.

6. A method of controlling an internal combustion engine, comprising:
    sensing an operating condition of the engine and producing an analog detection signal;
    converting the analog signal to digital data and supplying the data to a processor;
    sensing engine speed;
    producing pulse signals by the speed sensing;
    supplying the pulse signals to the processor as interrupt signals;
    supplying a frequency calculating program to the processor from a read only memory;
    executing the frequency calculation program upon completion of predetermined periods;
    supplying a main engine control program to the processor from a read only memory;
    executing the main control program upon completion of the frequency calculating program;
    supplying an interruption program to the processor from the read only memory upon each interrupt signal; and
    executing the interruption program no more than twice during each predetermined period.

* * * * *